(12) United States Patent
Mateman (10) Patent No.: US 8,581,636 B2
(45) Date of Patent: Nov. 12, 2013

(54) SAMPLE-AND-HOLD CIRCUIT ARRANGEMENT

(75) Inventor: Paul Mateman, Millingen aan de Rijn (NL)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/337,110

(22) Filed: Dec. 24, 2011

(65) Prior Publication Data

US 2013/0162455 A1    Jun. 27, 2013

(51) Int. Cl.
*H03K 5/00* (2006.01)

(52) U.S. Cl.
USPC .................................. 327/96; 327/91; 327/94

(58) Field of Classification Search
USPC ...................................................... 327/91–96
See application file for complete search history.

(56) References Cited

U.S. PATENT DOCUMENTS

| | | | | |
|---|---|---|---|---|
| 4,438,354 A | * | 3/1984 | Haque et al. | 327/337 |
| 5,081,372 A | * | 1/1992 | Pelgrom | 327/95 |
| 5,281,860 A | * | 1/1994 | Krenik et al. | 327/407 |
| 5,617,093 A | | 4/1997 | Klein | |
| 6,452,424 B1 | * | 9/2002 | Shamlou et al. | 327/91 |
| 7,015,729 B1 | | 3/2006 | Tursi et al. | |
| 7,420,490 B2 | | 9/2008 | Gupta et al. | |
| 2006/0164279 A1 | | 7/2006 | Brewer et al. | |
| 2008/0024351 A1 | * | 1/2008 | Gupta et al. | 341/172 |
| 2011/0200070 A1 | | 8/2011 | Makinwa et al. | |
| 2011/0241912 A1 | | 10/2011 | Doris et al. | |

FOREIGN PATENT DOCUMENTS

WO    2011/036529 A2    3/2011

OTHER PUBLICATIONS

A. Gupta et al., Design Techniques for Low Noise and High Speed A/D Converters, Thesis for M.Sc., 2006, Texas A&M Univ.
EPO, Int'l Search Report in PCT/EP2012/076680, Apr. 9, 2013.

* cited by examiner

*Primary Examiner* — Lincoln Donovan
*Assistant Examiner* — Jung H. Kim
(74) *Attorney, Agent, or Firm* — Potomac Patent Group PLLC (57) ABSTRACT

Sample-and-hold circuits typically operate at maximum speed when the sampling phase is much shorter than the holding phase. Thus, a device driving the sampling capacitor is disconnected most of the time. Methods and apparatus use the holding phase to store the full charge required by the sampling capacitor to track the amplifier output in at least two "boost" capacitors configured such that when the sampling capacitor is switched to the driver, the boost capacitors are also switched to the driver. Thus, the sampling capacitor is almost instantly charged to the required voltage, and the driver needs to supply only any remaining "error" charge, avoiding delays due to driver output slewing.

9 Claims, 5 Drawing Sheets

SAMPLE-AND-HOLD CIRCUIT ARRANGEMENT

BACKGROUND

This invention relates to electronic circuits, and in particular to sample-and-hold circuits.

Sample-and-hold (S/H) electronic circuits are commonly used in or in combination with analog-to-digital converters (ADCs), sigma-delta modulators, and other electronic devices. The sampling (or tracking) and holding of the value of an input signal is usually performed by a capacitor, which is usually disconnected (switched) from the input signal during the hold period.

Figure 1A:
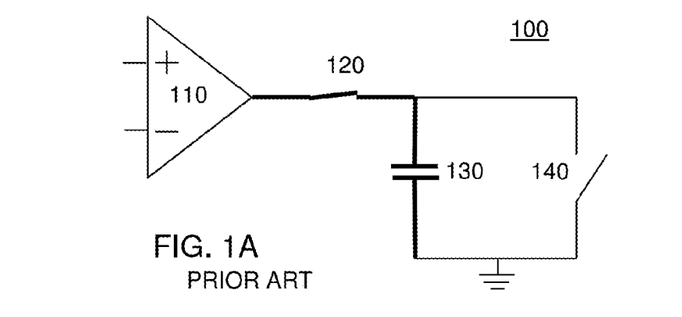
FIG. 1A depicts a conventional sample-and-hold circuit in a sampling phase.
Figure 1B:
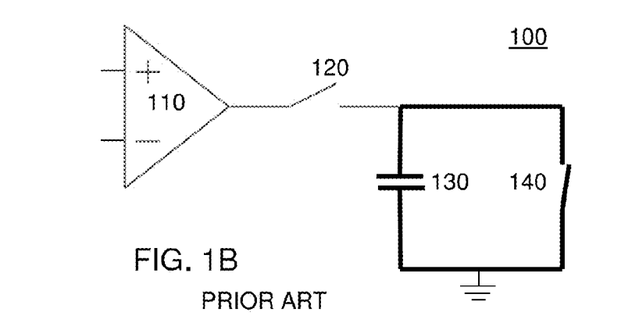
FIG. 1B depicts the conventional sample-and-hold circuit in a conversion phase.

FIG. 1A schematically depicts a conventional S/H circuit 100 in the sampling phase, and FIG. 1B schematically depicts the conventional S/H circuit 100 in the holding phase. As shown in FIGS. 1A, 1B, the circuit 100 has an input driver amplifier 110 that produces an output signal connected through a controllable switch 120 to a sampling capacitor 130, which can be discharged through a controllable switch 140. During the sampling phase (FIG. 1A), the switch 120 is closed and the switch 140 is open, and so the sampling capacitor 130 is connected on one side to the input driver, which is depicted as an operational amplifier having direct (+) and inverting (−) inputs, and on the other side to ground, or earth, or another suitable reference potential. During the holding phase (FIG. 1B), the switch 120 is open, and so the sampling capacitor is disconnected from the driver 110. The sampling capacitor is typically discharged during the holding phase or is reset (discharged) before the start of the next sampling phase, and such operation is represented by closure of the switch 140.

Successive-approximation register ADCs (SAR-ADCs) with capacitor-based internal digital-to-analog converters (DACs) have recently regained interest, mainly because of their power efficiency and the good capacitor-matching possible in deep submicron integrated circuit fabrication processes. This type of ADC combines a S/H circuit, which is sometimes also called a track-and-hold (T/H) circuit with the internal DAC. A typical conversion starts with charging the sampling capacitor to the input voltage, followed by a successive approximation process, in which the charge on the sampling capacitor is gradually driven to zero. SAR-ADCs, as well as sigma-delta ADCs and other devices using S/H circuits are described in U.S. Patent Application Publications No. US 2011/0241912 A1 by Doris et al. and No. US 2011/0200070 A1 by Makinwa et al., for example.

A problem with the conventional S/H circuit 100 and devices, such as SAR-ADCs, that include conventional S/H circuits is that the driver amplifier 110 needs to supply substantial current to charge up the sampling capacitor 130 when the sampling capacitor is switched to the signal that is to be sampled, i.e., the amplifier output signal. If the driver amplifier 110 is unable to provide the high current, the driver output signal will take time to slew to its proper value. Such time delay can be unacceptable in a wide variety of applications of S/H circuits.

Some approaches to solving that problem are known. For example, U.S. Patent Application Publication No. US 2008/0024351 A1 by A. Gupta et al. and Section 3.2 of A. Gupta, "Design Techniques for Low Noise and High Speed A/D Converters", Thesis for Master of Science, Texas A&M Univ. (2006) disclose S/H circuits that include pre-charge capacitors that store charge during the conversion (or holding) phase and that use the stored charge to load part, e.g., 90%, of the charge required by the sampling capacitor. Coarse and fine sampling phases are provided to ensure that the sampling capacitor settles fast.

International Publication WO 2011/036529 A2 by O. Moldsvor et al. states that it discloses a circuit having an input, two or more sampling capacitors, means for connecting each sampling capacitor to the input, means for discharging the sampling capacitors to a given voltage in a reset phase, and means for using a voltage across a sampling capacitor for processing in a conversion phase. The two sampling capacitors are operated in anti-phase such that the reset and sampling phases of one channel are performed during the period that the other channel is in the conversion (or holding) phase. Nevertheless, current spikes are still demanded from the driver amplifiers when the sampling capacitors are switched.

U.S. Pat. No. 5,617,093 to Klein states that it discloses a filter of a type that transfers charge packets through the filter that are proportional to the magnitude of periodic samples of an input signal. The filter's effective input capacitance is minimized by providing a supplemental source that charges the filter's input capacitor to a level approximately the same as the level that would be reached for the input signal. This can be expected to work only when the input frequency is much lower than the sampling rate, which is typically not the case in a S/H circuit for an ADC. In fact, the input capacitance is doubled when the input frequency is one-half the sampling frequency, which is undesirable in an ADC.

SUMMARY

The problem of supplying high currents when a sampling capacitor is switched and other problems suffered by previous methods and devices are solved by methods and apparatus in accordance with this invention.

In accordance with aspects of this invention, there is provided an arrangement in a sample-and-hold electronic circuit. The arrangement includes an amplifier configured to receive an input signal and to produce an output signal; a controllable sampling switch in communication with the amplifier; a sampling capacitor configured to receive the output signal through the sampling switch when the sampling switch is closed; a boost circuit configured to receive the output signal independent of whether the sampling switch is closed or open and to be in parallel with the sampling capacitor when the sampling switch is closed; and a control circuit configured for generating control signals for the controllable sampling switch and the first, second, and third controllable switches that switch the arrangement between a sampling phase and a holding phase. The boost circuit includes at least one first capacitor-switch arrangement in parallel with at least one second switch-capacitor arrangement and at least one third controllable switch connected between the at least one first capacitor and the at least one second capacitor. The at least one first capacitor-switch arrangement includes a first capacitor connected in series with a first controllable switch, and the at least one second switch-capacitor arrangement includes a second controllable switch connected in series with a second capacitor.

Also in accordance with aspects of this invention, there is provided a method in a sample-and-hold electronic circuit. The method includes (a) draining, from a capacitor, a charge representative of a signal produced by an amplifier; (b) switching the capacitor to the signal produced by the amplifier; and (c) upon switching, distributing a portion of a boost charge to the capacitor, the portion being substantially equal to the charge representative of the signal produced by the amplifier upon switching.

BRIEF DESCRIPTION OF THE DRAWINGS

The various features, objects, and advantages of this invention will become apparent by reading this description in conjunction with the drawings, in which like reference numerals indicate like components and in which.

DETAILED DESCRIPTION

The inventor has recognized that an ADC or other device using a S/H circuit typically operates at maximum speed when the sampling phase is much shorter than the holding phase (i.e., the conversion phase). Thus, the driver amplifier is disconnected from the sampling capacitor most of the time. Methods and apparatus in accordance with this invention use the holding phase to store the full charge required by the sampling capacitor to track the amplifier output in at least two "boost" capacitors, which are configured such that when the sampling capacitor is switched to the driver, the boost capacitors are also switched to the driver. As a result, the sampling capacitor is almost instantly charged to the required voltage, and the driver amplifier needs to supply only any remaining "error" charge, which is ideally zero. Charge transfer from the boost capacitors to the sampling capacitor is limited in speed by only switch resistances, and delays due to amplifier output slewing are avoided.

Figure 2A:
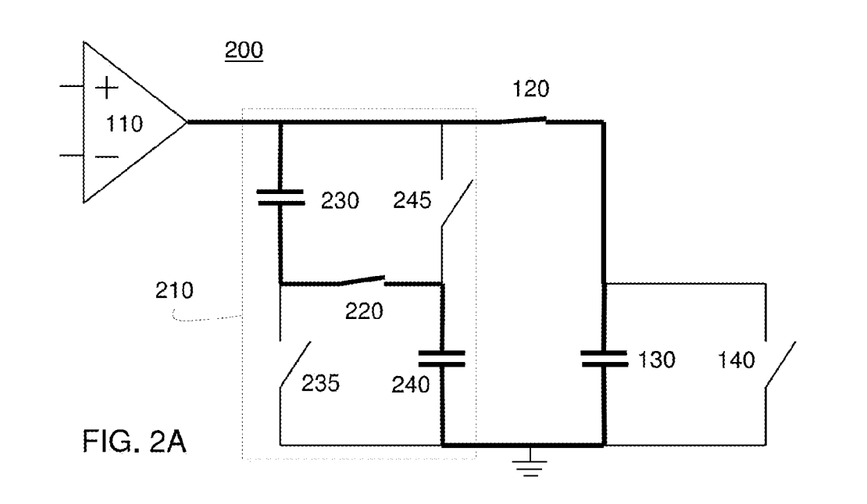
FIG. 2A depicts an example of a sample-and-hold circuit in accordance with this invention in a sampling phase.
Figure 2B:
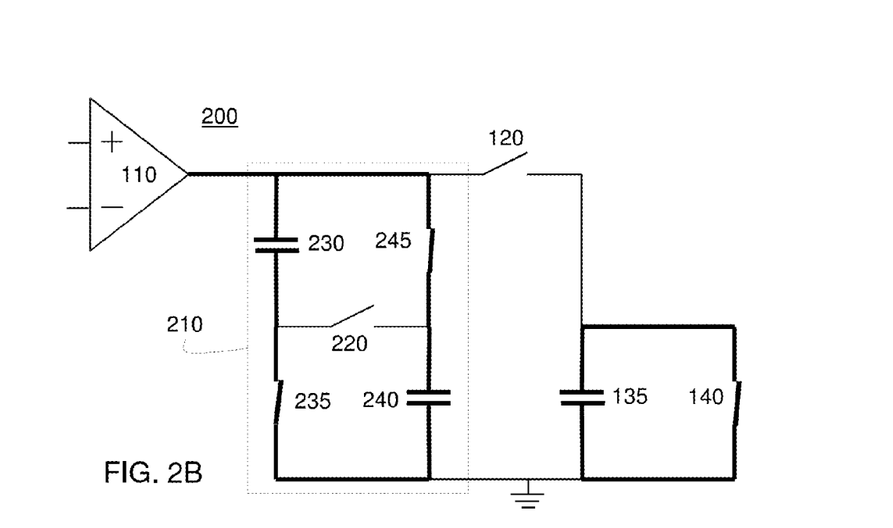
FIG. 2B depicts the example of a sample-and-hold circuit in accordance with this invention in a conversion phase.

FIG. 2A depicts an example of a S/H electronic circuit 200 in accordance with this invention in the sampling phase, during which the sampling capacitor 130 is connected to the driver amplifier 110 through a controllable sampling switch 120. FIG. 2B depicts the example S/H circuit 200 in the conversion phase, during which the sampling capacitor 130 is discharged (or reset at the end of the conversion).

As depicted in FIGS. 2A, 2B, the S/H electronic circuit 200 includes an amplifier 110, a controllable sampling switch 120 in communication with the amplifier, and a sampling capacitor 130. The amplifier 110 is configured to receive an input signal and to produce an output signal, and is depicted as an operational amplifier. The artisan will recognize that many kinds of amplifier 110 can be used in the circuit 200. The sampling capacitor 130 is configured to receive the amplifier's output signal through the controllable sampling switch 120 when the switch 120 is closed.

The circuit 200 also includes a boost circuit 210 that is configured to receive the amplifier output signal independent of whether the sampling switch 120 is closed or open and to be in parallel with the sampling capacitor 130 when the sampling switch is closed. The boost circuit 210 stores the full charge required by the sampling capacitor 130 to track the amplifier output.

As depicted in FIGS. 2A, 2B, the boost circuit 210 includes at least one first capacitor-switch arrangement, at least one second switch-capacitor arrangement, and a third controllable switch 220. The first capacitor-switch arrangement includes a first capacitor 230 in series with a first controllable switch 235, and the second capacitor-switch arrangement includes a second controllable switch 245 in series with a second capacitor 240. One terminal of the first capacitor 230 is connected to the amplifier 110, and the other terminal of the first capacitor 230 is connected to one terminal of the third switch 220, as is one terminal of the first switch 235. One terminal of the second switch 245 is connected to the amplifier 110, and the other terminal of the second switch 245 is connected to the other terminal of the third switch 220, as is one terminal of the second capacitor 240. Thus, the third switch 220 is connected between the at least one first capacitor 230 and the at least one second capacitor 240. As depicted in FIGS. 2A, 2B, the other terminal of the first switch 235 and the other terminal of the second capacitor 240 are connected together and to one of the terminals of the sampling capacitor 130.

During the sampling phase (FIG. 2A), the sampling switch 120 is closed and the switch 140 is open, and at the same time, the first and second switches 235, 245 are open and the third switch 220 is closed. Thus, the sampling capacitor 130 and the boost capacitors 230, 240 are connected in parallel to the input driver 110, with the boost capacitors connected in series with each other. The boost capacitors 230, 240 are thereby configured to supply the charge needed by the sampling capacitor 130 to reach the voltage of the amplifier output signal.

During the holding (or conversion) phase (FIG. 2B), which as noted above is substantially longer than the sampling phase, the sampling switch 120 is open, and at the same time, the first and second switches 235, 245 are closed and the third switch 220 is open. Thus, the sampling capacitor 130 is disconnected from the amplifier 110 and the boost capacitors 230, 240, which are connected in parallel to the amplifier 110. The boost capacitors 230, 240 are thereby configured to accumulate charge that can be supplied to the sampling capacitor 130 at the start of the next sampling phase.

As described above, the sampling capacitor is typically discharged during the holding phase or is reset (discharged) before the start of the next sampling phase, and such operation is represented by closure of the switch 140. It will be noted that FIGS. 2A, 2B depict a S/H circuit having two boost capacitors 230, 240, but it will be understood that more than two equivalently connected boost capacitors, and more than two equivalently connected boost switches 235, 245, can be provided. Moreover, the artisan will understand that each boost capacitor 235, 245 can be implemented as a plurality of capacitors connected in series. Although FIGS. 2A, 2B depict one third switch 220, the artisan will also understand that more than one equivalently connected third switch can be provided.

In general, the capacitances of the first and second capacitors 230, 240 are substantially equal, which is not difficult to ensure in current integrated circuit fabrication processes. In addition, the capacitances of the boost capacitors 230, 240 are preferably greater than the capacitance of the sampling capacitor 130 in order to provide faster charging of the sampling capacitor 130. For example, the capacitance of each capacitor 230, 240 is advantageously twice the capacitance of the sampling capacitor 130.

Capacitance is defined as Q=C·V, in which Q represents charge stored in the capacitor, C represents capacitance, and V represents the voltage across the capacitor, and it is known that the total capacitance $C_{tot}$ of two capacitors $C_1$, $C_2$ connected in parallel is given by $C_{tot}=C_1+C_2$ and that the total capacitance of two capacitors connected in series is given by:

$$C tot = \frac{1}{\frac{1}{C1} + \frac{1}{C2}}$$

When two capacitors are connected in parallel, their voltages very quickly equalize as the stored charges redistribute.

Thus, assuming the sampling capacitor 130 is completely discharged, the following equation obtains:

$$\frac{Cboost\_series}{Csampling} = \frac{1}{\frac{Vboost}{Vin} - 1}$$

in which $C_{boost\_series}$ represents the capacitance of the boost capacitors 230, 240 connected in series, $C_{sampling}$ represents the capacitance of the sampling capacitor 130, $V_{boost}$ represents the voltage across the series-connected boost capacitors, and $V_{in}$ represents the voltage output of the input driver 110. For a number N of identical boost capacitors $C_{boost}$, their series connection yields $V_{boost}=N \cdot V_{in}$ and $C_{boost\_series}=C_{boost}/N$. The ratio of the voltages needs to be greater than 1 from the preceding equations, and so N≥2. In general for the boost charge equal to the required charge, we have after some manipulation:

$$\frac{Cboost}{Csampling} = \frac{N}{N-1}$$

Since the capacitor area is linear with the capacitance, the area is linear with N·N/(N−1), and so the most area-efficient choice is N=2. It will also be appreciated that many amplifiers do not "like" capacitive loads, which also motivates minimizing the number N of boost capacitors.

Figure 3:
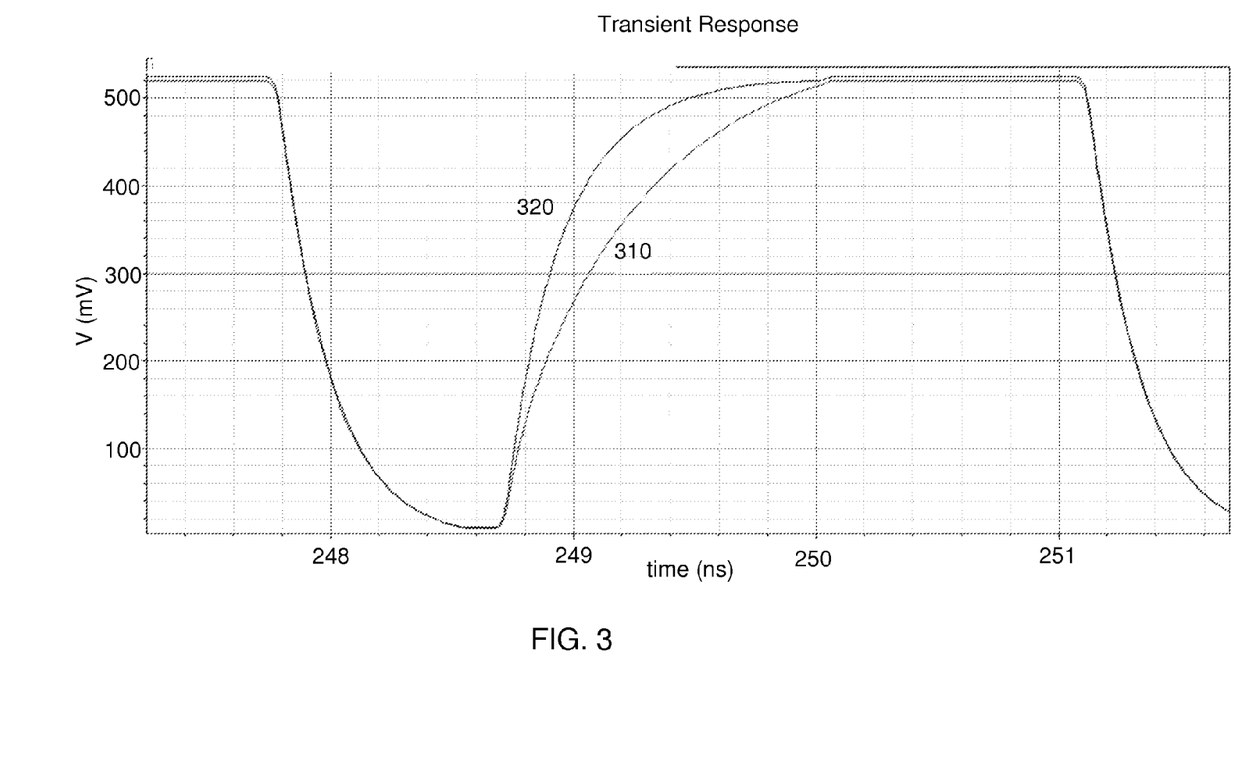
FIG. 3 shows plots of sampling capacitor voltage versus time for the conventional sample-and-hold circuit and for the example of a sample-and-hold circuit in accordance with this invention.

FIG. 3 shows plots of simulations of the voltage in millivolts (mV) across the sampling capacitor 130 (vertical axis) versus time in nanoseconds (ns) (horizontal axis). The simulations included contributions from dominant parasitic capacitances. The curve 310 indicates the response of a conventional S/H circuit 100, and the curve 320 indicates the response of a S/H circuit 200 in accordance with this invention, with the capacitance of each capacitor 230, 240 twice the capacitance of the sampling capacitor 130. It will be noted for the plots that the sampling capacitor was discharged or reset completely during the holding (conversion) phase, with conversion modeled by simply short-circuiting the sampling capacitor through a switch 140. It can be observed by comparing the exponential (RC) rises in the curves 310, 320 that the speed of charging the sampling capacitor by the boost capacitors (and amplifier) is limited mainly by the resistance of the switch 220.

In an integrated circuit, the controllable switches 220, 235, 245 as well as the switch 120 (and switch 140) can be negative metal-oxide-semiconductor (NMOS) field-effect transistors (FETs) or positive MOS (PMOS) FETs or a combination of them. Signals for controlling the switches, considered together, need to ensure break-before-make operation. Break-before-make in this context means, in transitioning from the configuration in FIG. 2A to the configuration in FIG. 2B, the switches 120, 220 open before the switches 235, 245 (and 140) close, and in transitioning from the configuration in FIG. 2B to the configuration in FIG. 2A, the switches 235, 245 (and 140) open before the switches 120, 220 close. Thus, non-overlapping switch control signals, or clock signals, are needed, which is to say that two-phase control signals are needed, with switch control signals of opposite phase never active at the same time. As a result, one phase of switch control signal cannot be simply a delayed version of the other phase.

Figure 4:
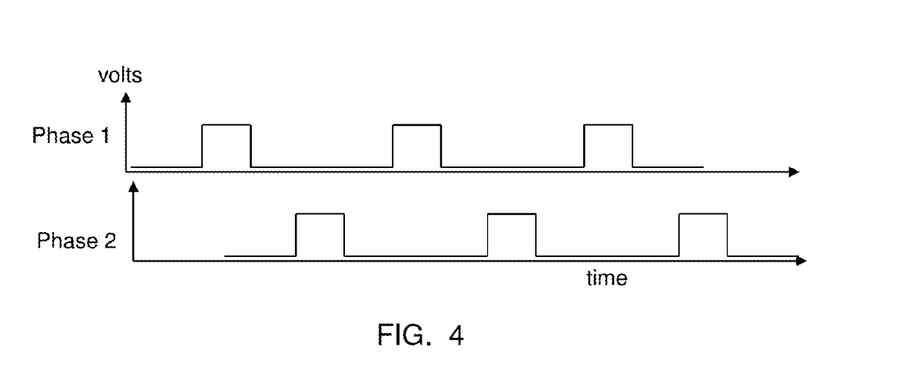
FIG. 4 depicts an example of switch control signals.

FIG. 4 schematically depicts suitable control signals for NMOS FET switches, with the Phase 1 control signal being applied to the gates of the switches 120, 220, and the Phase 2 control signal being applied to the gates of the switches 235, 245 (and 140). As described above, the duty cycle of the S/H circuit is expected to be low (i.e., the sampling phase is much shorter than the holding phase), and so the ON time of the Phase 1 control signal is much shorter than the OFF time. The signals depicted in FIG. 4 are not drawn to scale. It would be enough if the Phase 2 control signal ensured break-before-make. The artisan will understand that control signals for PMOS switches can simply have reversed polarity. If clock injection compensation is provided, parallel switches (PMOS/NMOS) are switched sequentially and carefully adjusted, although such an arrangement of switches may be used infrequently. A suitable controller circuit can generate such switch control signals generating break-before-make switching.

Among the advantages of circuits in accordance with this invention is a reduced peak current requirement imposed on the input driver, which typically means the input driver can be physically smaller and use less current than drivers in other circuits. In addition, the boost capacitors do most of the charge-transfer work, reducing input driver slewing, and as the driver slews less, the driver's settling becomes linear.

Another advantage of circuits in accordance with this invention is that the switches in the boost circuit 210 perform a kind of clock charge injection compensation for the charge that is kicked into the driver amplifier 110 by operation of MOS-transistor switches.

Figure 5A:
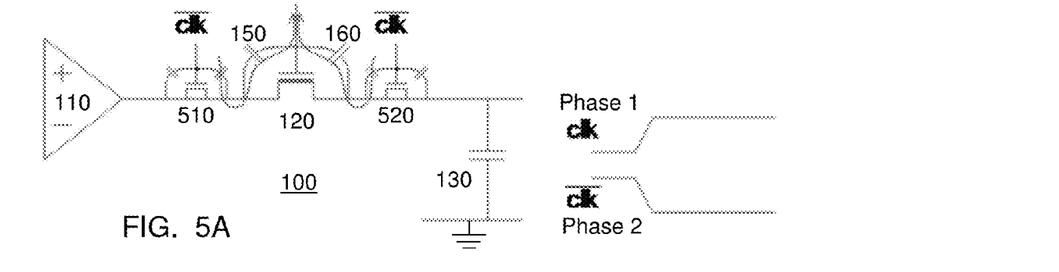
FIGS. 5A, 5B illustrate charge injection compensation in a portion of the sample-and-hold circuit depicted in FIG. 1.
Figure 5B:
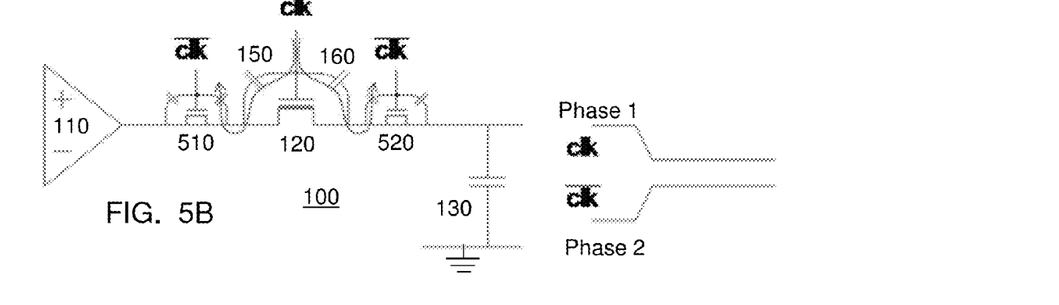

FIGS. 5A, 5B illustrate clock charge injection compensation in a portion of the S/H circuit 100, with the sampling switch 120 as an NMOS transistor with its gate receiving the switch control or clock signal. Capacitors 150, 160 represent the intrinsic channel and overlap capacitances that exist in MOS switches. Although those capacitances cannot be removed, they can be compensated if required by the application of the S/H circuit, and such compensation is usually required for ADCs. Proper compensation can be done with a (dummy) switch of the same type as the sampling switch, so that when using fast switch control signals, typically half of the injected charge goes to the drain terminal and the other half goes to the source terminal of the transistor. As shown in FIGS. 5A, 5B, the sampling switch 120 is compensated with half-size dummy switches 510, 520, which can be called "half size" because the source and drain terminals of each switch are connected together.

As depicted in FIG. 5A, when the Phase 1 clock signal goes HIGH and closes the sampling switch 120, charge (depicted by arrows) flows out of the Phase 2 clock generator (not shown) through an intrinsic capacitance of the dummy switch 510 and through the intrinsic capacitor 150 into the Phase 1 clock generator (not shown), and also out of the Phase 2 clock generator through an intrinsic capacitance of the dummy switch 520 and through the intrinsic capacitor 160 into the Phase 1 clock generator. As depicted in FIG. 5B, when the Phase 1 clock signal goes LOW and opens the sampling switch 120, charge (depicted by arrows) flows from the Phase 1 clock signal generator (not shown) through the intrinsic capacitor 150 and an intrinsic capacitance of the dummy switch 510 into the Phase 2 clock generator (not shown), and through the intrinsic capacitor 160 and an intrinsic capacitance of the dummy switch 520 into the Phase 2 clock generator.

Figure 6:
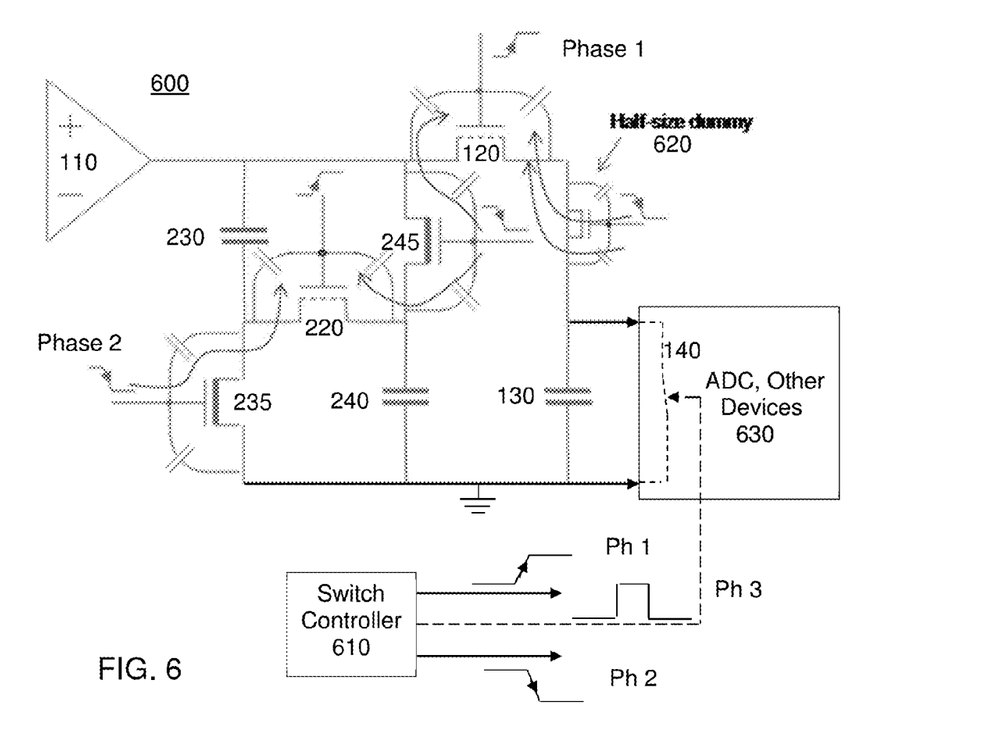
FIG. 6 depicts an example of a sample-and-hold circuit that includes a charge-injection compensation arrangement in accordance with this invention.

FIG. 6 depicts an example of a S/H circuit 600 that includes a clock-injection compensation arrangement in accordance with this invention. The circuit 600 is substantially the same as the circuit 200, but for clock-injection compensation by a dummy switch 620 connected between the sampling switch 120 and the sampling capacitor 130. As shown, the dummy switch 620 is a further NMOS FET whose gate is configured to receive the signal that controls the first and second switches 235, 245. The charge injection caused by the MOS switches is substantially cancelled by adjacent switches of the opposite phase. Although it might appear that the circuit 600 does not provide clock injection compensation as complete as the arrangement depicted in FIG. 5, the circuit 600 does provide complete compensation because the dummy switch 510 is no longer needed, as the switch 245 helps compensate the charge injection. Since the charge to be handled is about half, the transistor switch size can also be "half", which can be conveniently provided by a dummy transistor whose source and drain terminals are connected together.

Clock-injection compensation schemes can be quite elaborate, depending on the circuit requirements. Nowadays, first-order compensation is done as depicted in the Figures, and the rest of the compensation is provided by other techniques, such as by one or more of differential circuit topology, calibration, and signal conditioning. It will be noted that the charge required for the sampling capacitor is the largest, but is also relatively slow. The charge associated with clock injection is much smaller, but has very sharp edges (very short rise-times), and so is still capable of disturbing the driver amplifier, or sampled voltage.

FIG. 6 also depicts the intrinsic capacitances of the sampling switch 120, the first and second boost switches 235, 245, and the third switch 220, which are assumed to be NMOS FETs, and control signal edges that enable easier understanding of switch control signal charge flows. The control or clock signals depicted in FIG. 6, and in other drawings of this application, can be generated by a suitable controller 610 that generates signals suitable for opening and closing switches at appropriate times. It will be appreciated that the controller 610 can be implemented by one or more suitably programmed electronic processor circuits, suitable collections of logic gates, suitable collections of timers, transistors, and associated components, etc.

As indicated by the clock signal edges, FIG. 6 depicts charge flows just as the S/H circuit 600 transitions from the holding phase (corresponding to FIG. 2B) to the sampling phase (corresponding to FIG. 2A), which is to say, just before the closed (made) switches 235, 245 open (break) and the open switches 120, 220 close. Just before the Phase 1 clock goes HIGH and closes the open sampling switch 120 and third switch 220 (indicated by the dashed-line gate channels), the Phase 2 clock goes LOW at the dummy switch 620 and opens the closed first and second boost switches 235, 245 (indicated by the solid-line gate channels). Charge (depicted by arrows) flows out of the Phase 2 clock line from the generator 620 through the intrinsic capacitances of the dummy switch 620 and through an intrinsic capacitance of the sampling switch 120 into the Phase 1 clock line and the signal generator 620. Charge also flows out of the Phase 2 clock line through intrinsic capacitances of the first boost switch 235 and through an intrinsic capacitance of the third switch 220 into the Phase 1 clock line. Charge also flows out of the Phase 2 clock line through an intrinsic capacitance of the second boost switch 245 and an intrinsic capacitance of the sampling switch 120 into the Phase 1 clock line. Charge also flows out of the Phase 2 clock line through an intrinsic capacitance of the second boost switch 245 and an intrinsic capacitance of the third switch 220 into the Phase 1 clock line.

It will be seen from FIG. 6 that the dummy switch 620 cancels the error due to clock injection into the sampling capacitor by the boost circuit and that most of the switches are already compensated by a neighboring switch of the opposite polarity. Clock injection is negligible in comparison to the step caused by switching the boost capacitors 230, 240 from series-connected (FIG. 2A) to parallel-connected (FIG. 2B), and so providing clock injection compensation as in FIG. 6, for example, has negligible impact on the driver amplifier 110.

It is preferable that the side of the sampling switch 120 that is connected to the sampling capacitor 130 should be compensated always, but compensation on the side of the switch 120 that is connected to the driver amplifier 110 is less important as that side sees a step of half the amplifier output voltage when the sampling capacitor is switched. That step arises because each booth boost capacitor 230, 240 carries half the output voltage (assuming their capacitances are well matched), and so when the boost capacitors are switched to parallel-connected, the output voltage is halved until the driver 110 has had time to supply the lost charge. Upon switching on (i.e., closing the sampling switch 120), the arrangement of the switches in the circuit 600 cancels the clock injection contribution, and so to a first-order approximation, the sampling error depends on only the mismatch of the boost capacitors 230, 240. Any sampling error due to switch mismatch (e.g., imperfect clock-injection compensation) is even lower.

FIG. 6 also shows that the value of the output signal produced by the amplifier 110 and held by the sampling capacitor 130 is provided to a device 630, which can include ADCs, modulators, and a wide variety of electronic devices, such as those described in U.S. Patent Application Publications No. US 2011/924192 and No. US 2011/0200070 cited above. As described above, the sampling capacitor 130 needs to be more or less fully discharged before the sampling switch 120 closes at the start of a sampling period. Some ADCs and other devices discharge the sampling capacitor during conversion, and so a (closed) discharge switch 140 is indicated by dashed lines in the device 630. If the device 630 does not discharge the sampling capacitor during conversion, a discharge switch 140 can be provided that is controlled by a Phase 3 clock signal that is active between the end of the conversion and the beginning of the sampling phase. It will be understood that the Phase 3 clock signal can be readily produced by the controller 610.

Of course, the operation of a circuit such as the example depicted in FIG. 6 is consistent with aspects of this invention in that the boost capacitors are (slowly) charged in the (long) holding phase, during which an ADC can be performing a successive approximation process or another electronic device can be using the held value of the driver output signal, and (extremely) fast current redistribution quickly charges the sampling capacitor at the start of the (short) sampling phase so that the driver amplifier needs to deal only with any mismatch of the capacitors (and to a lesser degree, any mismatch of the switches).

Figure 7:
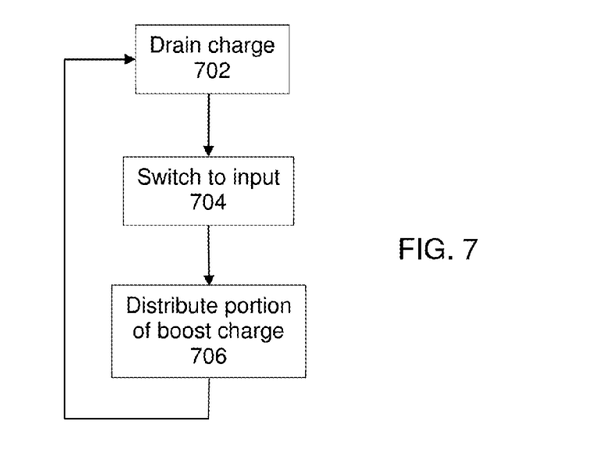
FIG. 7 is a flow chart of a method in accordance with this invention.

Thus, FIG. 7 is a flowchart that depicts a method in a S/H amplifier in accordance with aspects of this invention. In step 702, charge representative of a signal produced by an amplifier, such as an amplifier 110, is drained from a capacitor, such as the sampling capacitor 130, for example by operating an ADC or other device 630 connected to the capacitor or a discharge switch 140 connected across the capacitor. In step 704, the capacitor is switched to the signal produced by the amplifier, e.g., by operation of a sampling switch 120. Upon the switching, a portion of a boost charge is distributed (step 706) to the capacitor, e.g., by operation of a boost circuit 210. As described above, the boost charge is greater than the charge that is representative of the signal produced by the amplifier upon switching, and the portion of the boost charge distributed to the sampling capacitor is substantially equal to the charge that is representative of the signal produced by the amplifier upon switching. The process flow can then return to step 702, thereby enabling tracking and controllably holding the signal produced by the amplifier. Moreover, the method can further include controllably discharging the capacitor just before switching the capacitor to the signal produced by the amplifier. Furthermore, the boost charge can be twice the charge representative of the signal produced by the amplifier upon switching.

In comparison to the circuits described in the documents by Gupta cited above, circuit arrangements in accordance with this invention supply substantially exactly the charge required by the sampling capacitor when the circuit transitions from holding to sampling, not just a large part of it. As a result, current spikes still occur in Gupta's arrangements but do not occur in arrangements in accordance with this invention. Gupta's circuits also suffer from much heavier loading on the input amplifier during pre-charging (e.g., 10 times the sampling capacitance) because Gupta always has two capacitors in parallel, but circuits in accordance with this invention reduce the loading on the input amplifier over time (e.g., 4 times the sampling capacitance). Moreover, circuit arrangements in accordance with this invention can include clock-injection compensation, and are expected to be two to three times faster during pre-charge and require input amplifiers that need only to correct small sampling errors.

The methods and devices described above can be combined and re-arranged in a variety of equivalent ways, and the methods can be performed by one or more suitable electronic circuits (e.g., discrete logic gates interconnected to perform a specialized function, or application-specific integrated circuits). Devices embodying this invention can include, for example, ADCs, DACs, electronic sensors, telephones, computers, and the like.

Thus, the invention may be embodied in many different forms, not all of which are described above, and all such forms are contemplated to be within the scope of the appended claims.

What is claimed is:

1. An arrangement in a sample-and-hold electronic circuit, comprising:
    an amplifier configured to receive an input signal and to produce an output signal;
    a controllable sampling switch in communication with the amplifier;
    a sampling capacitor configured to receive the output signal through the sampling switch when the sampling switch is closed;
    a boost circuit configured to receive the output signal independent of whether the sampling switch is closed or open and to be in parallel with the sampling capacitor when the sampling switch is closed, wherein the boost circuit comprises:
    at least one first capacitor-switch arrangement in parallel with at least one second switch-capacitor arrangement, wherein the at least one first capacitor-switch arrangement includes a first capacitor connected in series with a first controllable switch, and the at least one second switch-capacitor arrangement includes a second controllable switch connected in series with a second capacitor;
    at least one third controllable switch connected between the at least one first capacitor and the at least one second capacitor; and
    a control circuit configured for generating control signals for the controllable sampling switch and the first, second, and third controllable switches that switch the arrangement between a sampling phase and a holding phase.

2. The arrangement of claim 1, wherein the control signals are such that the at least one third controllable switch is open when the sampling switch is open and is closed when the sampling switch is closed, that the at least one first and second switches are open when the sampling switch is closed and are closed when the sampling switch is open, and that the sampling switch and first, second, and third switches operate as break-before-make switches.

3. The arrangement of claim 1, further comprising a controllable discharge switch configured to discharge the sampling capacitor at a time when the sampling switch is open.

4. The arrangement of claim 1, wherein each of the first and second capacitors has a capacitance that is twice a capacitance of the sampling capacitor.

5. The arrangement of claim 1, wherein the sampling switch and first, second, and third switches are metal-oxide-semiconductor field-effect transistors (MOSFETs); the arrangement further comprises a further controllable MOSFET connected between the sampling switch and the sampling capacitor; a source and a drain of the further MOSFET are connected together; and a gate of the further MOSFET is configured to receive a signal that controls the first and second switches.

6. The arrangement of claim 1, wherein a value of the output signal produced by the amplifier and held by the sampling capacitor is provided to at least one further electronic device.

7. A method in a sample-and-hold electronic circuit, comprising:
    (a) draining, from a capacitor, a charge representative of a signal produced by an amplifier;
    (b) switching the capacitor to the signal produced by the amplifier; and
    (c) upon switching, distributing a portion of a boost charge to the capacitor, the portion being substantially equal to the charge representative of the signal produced by the amplifier upon switching;
    wherein the boost charge is greater than the charge representative of the signal produced by the amplifier and is distributed from at least one boost capacitor configured to receive the signal produced by the amplifier independent of switching the capacitor to the signal produced by the amplifier.

8. The method of claim 7, further comprising repeating (a), (b), and (c), thereby tracking and repeatedly holding samples of the signal produced by the amplifier.

9. The method of claim 7, wherein the boost charge is at least twice the charge representative of the signal produced by the amplifier upon switching.

* * * * *